(12) United States Patent
Do

(10) Patent No.: US 8,798,198 B2
(45) Date of Patent: Aug. 5, 2014

(54) CALIBRATION SYSTEMS FOR WIRELESS ELECTRONIC DEVICES

(75) Inventor: Gary Lang Do, San Jose, CA (US)

(73) Assignee: Apple Inc., Cupertino, CA (US)

( * ) Notice: Subject to any disclaimer, the term of this patent is extended or adjusted under 35 U.S.C. 154(b) by 401 days.

(21) Appl. No.: 13/222,553

(22) Filed: Aug. 31, 2011

(65) Prior Publication Data

US 2013/0052960 A1 Feb. 28, 2013

(51) Int. Cl.
H04K 1/02 (2006.01)

(52) U.S. Cl.
USPC ........... 375/297; 375/298; 375/268; 375/261; 375/285; 455/67.11; 455/114.2; 455/114.3; 455/115.1; 455/115.2; 455/115.3; 455/115.4; 332/103; 332/159; 332/161; 332/160; 332/162; 331/108 C; 331/182; 331/187; 331/2; 331/12; 331/47; 331/59; 331/108 B; 330/10; 330/149

(58) Field of Classification Search
USPC .......................... 375/297, 298, 268, 261, 285; 455/67.11, 114.2, 114.3, 115.1, 115.2, 455/115.3, 115.4; 332/103, 159, 161, 160, 332/162; 330/10, 149; 331/2, 12, 47, 59, 331/108 B, 108 C, 182, 187
See application file for complete search history.

(56) References Cited

U.S. PATENT DOCUMENTS 5,142,287 A 8/1992 LaBerge et al.
6,593,827 B2 7/2003 Chethik et al.
7,012,969 B2 * 3/2006 Ode et al. ...................... 375/296
7,555,057 B2 6/2009 Staszewski et al.
8,019,286 B2 * 9/2011 Lorenzen .................... 455/67.11
8,467,744 B2 * 6/2013 Wurm ............................ 455/102
2009/0138226 A1 * 5/2009 Raghavan et al. ............ 702/107
2011/0032080 A1 2/2011 Kunc et al.
2011/0275341 A1 11/2011 Landmark et al.

* cited by examiner

Primary Examiner — Daniel Washburn
Assistant Examiner — Rahel Guarino
(74) Attorney, Agent, or Firm — Treyz Law Group; G. Victor Treyz; Chih-Yun Wu

(57) ABSTRACT

A calibration system may be provided for calibrating wireless communications circuitry in an electronic device during manufacturing. The calibration system may include data acquisition equipment for receiving an amplitude-modulated calibration signal from the electronic device. The calibration system may include calibration computing equipment for extracting pre-distortion coefficients from the amplitude-modulated calibration signal. The calibration computing equipment may be configured to detect a bulk phase drift in the amplitude-modulated calibration signal. The calibration computing equipment may be configured to remove the bulk phase drift from the amplitude-modulated calibration signal. The wireless communications circuitry may include a power amplifier that distorts a signal generated by the wireless communications circuitry. The wireless communications circuitry may include a pre-distortion compensator for countering the distortion. The pre-distortion coefficients determined from the phase drift corrected amplitude-modulated calibration signal may be used by the pre-distortion compensator when countering the distortion.

18 Claims, 13 Drawing Sheets

CALIBRATION SYSTEMS FOR WIRELESS ELECTRONIC DEVICES

BACKGROUND

This related to calibration, and more particularly, to calibration of wireless communications circuitry in electronic devices.

Electronic devices such as portable computers and cellular telephones are often provided with wireless communications capabilities. For example, electronic devices may use long-range wireless communications circuitry such as cellular telephone circuitry to communicate using cellular telephone bands at 700 MHz, 850 MHz, 900 MHz, 1800 MHz, 1900 MHz, and 2100 MHz. Electronic devices may use short-range wireless communications circuitry to handle communications with nearby equipment. For example, electronic devices may communicate using the WiFi® (IEEE 802.11) bands at 2.4 GHz and 5 GHz and the Bluetooth® band at 2.4 GHz.

Wireless communications circuitry often includes a power amplifier that amplifies an electronic input signal to produce an amplified electronic output signal having more power than the input signal. The ratio of power of the output signal to the power of the input signal is commonly referred to as the gain of an amplifier. Power amplifiers commonly suffer from a non-linear gain in which a high power input signal is not amplified as much as a low power input signal (i.e., the gain is reduced for high power signals), and in which the phase of the output signal changes as a function of the input power. To compensate for this and other distortions of a signal by a power amplifier, wireless communications circuitry often includes a pre-distortion compensator circuit that alters an input signal to the power amplifier such that the output of the power amplifier is linear (i.e., the signal gain is the same) for a broader range of input signal powers. Pre-distortion compensator circuits take, as inputs, pre-distortion coefficients based on measured performance of the power amplifier.

In order to provide electronic devices that perform uniformly across all devices, each electronic device may be calibrated during manufacturing before delivery to end users. Calibration operations include determination of pre-distortion coefficients by measuring the performance of wireless communications power amplifiers in each device. Measuring the performance of power amplifiers in each electronic device can be time consuming and can therefore slow the pace of production of the devices and can increase the cost of productions.

It would therefore be desirable to provide improved calibration systems for electronic devices with wireless communications capabilities.

SUMMARY

A calibration system may be provided for calibrating wireless communications circuitry in an electronic device during manufacturing.

An electronic device may have wireless communications circuitry for handling wireless communications. The wireless communications circuitry may include transceiver circuitry and a power amplifier. The wireless communications circuitry may be configured to communicate with external equipment such as cellular network equipment and wireless local area network equipment. The transceiver may include a pre-distortion compensator for pre-processing a signal to the power amplifier and a calibration pattern generator to be used during calibration of the power amplifier. The calibration system may be configured to optimize pre-distortion coefficients that allow the pre-distortion compensator to preprocess a signal from the transceiver to the power amplifier such that the output signal from the power amplifier is a linear function of the input signal to the pre-distortion compensator.

During calibration, the calibration pattern generator may be used to generate a known, amplitude-modulated (AM) input signal that is transmitted using the wireless communications circuitry to data acquisition equipment in the calibration system. The data acquisition equipment may capture and digitize the transmitted AM test signal. The digitized AM signal may then be transferred to calibration computing equipment in the calibration system. The calibration computing equipment may then be used to extract bulk phase drift information from the digitized AM signal. The calibration computing equipment may then be used to correct the digitized AM signal using the extracted bulk phase drift information. The calibration computing equipment may then be used to compare the phase drift corrected AM signal with the known AM input signal and to extract pre-distortion coefficients from the compared input and phase drift corrected AM signals. The calibration computing equipment may then be used to transmit the determined pre-distortion coefficients back to the electronic device. The pre-distortion coefficients may be stored in the electronic device and used when altering signals with the pre-distortion compensator.

Further features of the invention, its nature and various advantages will be more apparent from the accompanying drawings and the following detailed description of the preferred embodiments.

DETAILED DESCRIPTION

Electronic devices such as cellular telephones, media players, computers, set-top boxes, wireless access points, and other electronic equipment having wireless communications circuitry may be calibrated during manufacturing. Wireless communications circuitry is often able to support multiple radio access technologies. For example, a device may include wireless communications circuitry for handling communications associated with "2G", "3G" and "4G" communications protocols. Wireless communications circuitry may include capabilities for handling communications using cellular telephone protocols, WiFi® (IEEE 802.11) communications protocols, Bluetooth® communications protocols, etc. Wireless communications using these communications protocols may be implemented using by modulating a carrier signal using a phase-shift keying (PSK) modulation scheme. A calibration system including calibration computing equipment and data acquisition equipment capable of receiving and processing PSK modulated signals may be used during calibration of devices. Following calibration, a device may be shipped to a customer.

Figure 1:
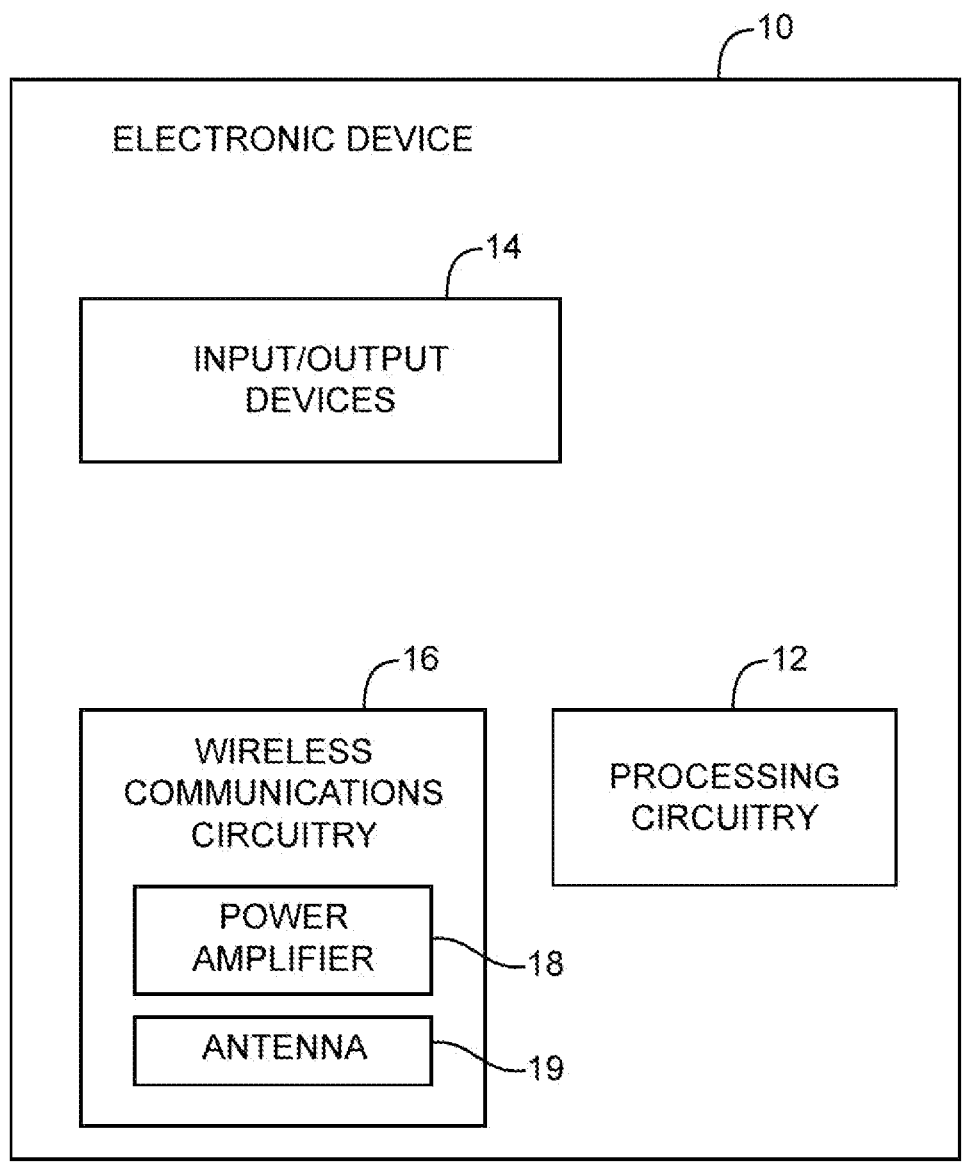
FIG. 1 is a diagram of an illustrative electronic device having wireless communications circuitry in accordance with an embodiment of the present invention.

An illustrative electronic device of the type that may be calibrated during manufacturing is shown in FIG. 1. As shown in FIG. 1, electronic device 10 may include processing circuitry 12, input-output devices 14, and wireless communications circuitry 16. Processing circuitry 12 may include microprocessors, microcontrollers, digital signal processor integrated circuits, application-specific integrated circuits, and other processing circuitry. Volatile and non-volatile memory circuits such as random-access memory, read-only memory, hard disk drive storage, solid state drives, and other storage circuitry may also be included in processing circuitry 12.

Processing circuitry 12 may use input-output devices 14 to obtain user input and to provide output to a user. Input-output devices 14 may include speakers, microphones, sensors, buttons, keyboards, displays, touch sensors, wireless circuitry such as wireless local area network transceiver circuitry and cellular telephone network transceiver circuitry, and other components for receiving input and supplying output.

Wireless communications circuitry 16 may include one or more power amplifiers such as power amplifier 18. Wireless communications circuitry 16 may include transceiver circuitry for handling communications at the GPS frequency of 1575 MHz, cellular telephone communications (e.g., communications in cellular bands at 700, 800, 900, 1800 1900, and 2100 MHz) or wireless local area network communications (e.g., in bands at 2.4 GHz or 5 GHz). Transceiver circuitry associated with wireless circuitry 16 may include or be associated with circuits such as low-noise amplifiers (LNAs) that are used to amplify incoming signals and power amplifiers such as power amplifier 18. Power amplifier 18 may be used to amplify outgoing signals. Transceiver circuitry associated with wireless circuitry 16 may include storage and processing circuitry and may communicate with other storage and processing circuitry in device 10. Storage may be used to store software code or calibration coefficients such as pre-distortion coefficients obtained during calibration operations for device 10.

Wireless communications circuitry 16 may include one or more antennas such as antenna 19. Antenna 19 may be formed using any suitable type of antenna. For example, antenna 19 may include antennas with resonating elements that are formed from loop antenna structures, patch antenna structures, inverted-F antenna structures, closed and open slot antenna structures, planar inverted-F antenna structures, helical antenna structures, strip antennas, monopoles, dipoles, hybrids of these designs, etc. Different types of antennas may be used for different bands and combinations of bands. For example, one type of antenna may be used in forming a local wireless link antenna (e.g., for handling WiFi® traffic or other wireless local area network traffic) and another type of antenna may be used in forming a remote wireless link antenna (e.g., for handling cellular network traffic such as voice calls and data sessions). There may be multiple antennas in device 10. These antennas may be fixed or may be tunable.

Figure 2A:
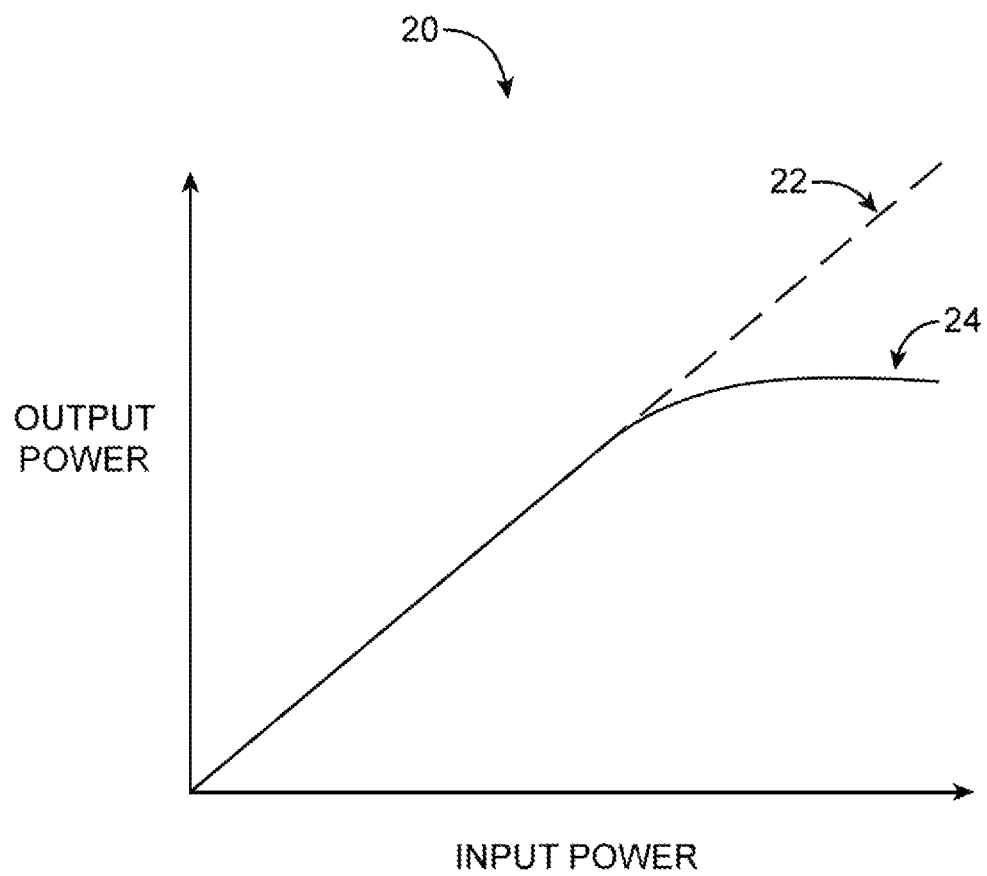
FIG. 2A is a graph of power amplifier performance for a typical power amplifier.

Power amplifiers such as power amplifier 18 often exhibit non-linear amplification of high power input signals as shown in FIG. 2A. Graph 20 of FIG. 2A shows how the amplified output power of a signal that is output from a common power amplifier changes with respect to the input power of a signal that is input to the power amplifier. A linear amplification (or constant gain) at all input powers is indicated by dashed line 22 (i.e., the slope of dashed line 22 is constant thereby indicating a constant gain at any input power). Solid line 24 shows that the actual output power of a common amplifier follows linear response curve 22 for relatively small input power. However, for input signals with relatively larger input power, the corresponding output power, as shown by real amplification curve 24, deviates from linear curve 22. Power amplifiers may exhibit other distorting behavior. For example, in addition to distorting the amplitude of an input signal, a power amplifier may include capacitive or inductive components that affect output of portions of an input signal and thereby generate distortions in the phase of an input signal. Power amplifiers often distort the frequency of an input signal in addition to distortions of the amplitude and phase of the input signal. In order to compensate for these signal distorting effects (e.g., amplitude distortion, phase distortion, frequency distortion, etc.), an electronic device such as device 10 of FIG. 1 may be provided with wireless communications circuitry that includes pre-distortion circuitry that applies an inverse (e.g., compensating) distortion to the input signal to a power amplifier that cancels or reduces known (e.g., previously measured) power amplifier distortions to the signal.

Figure 2B:
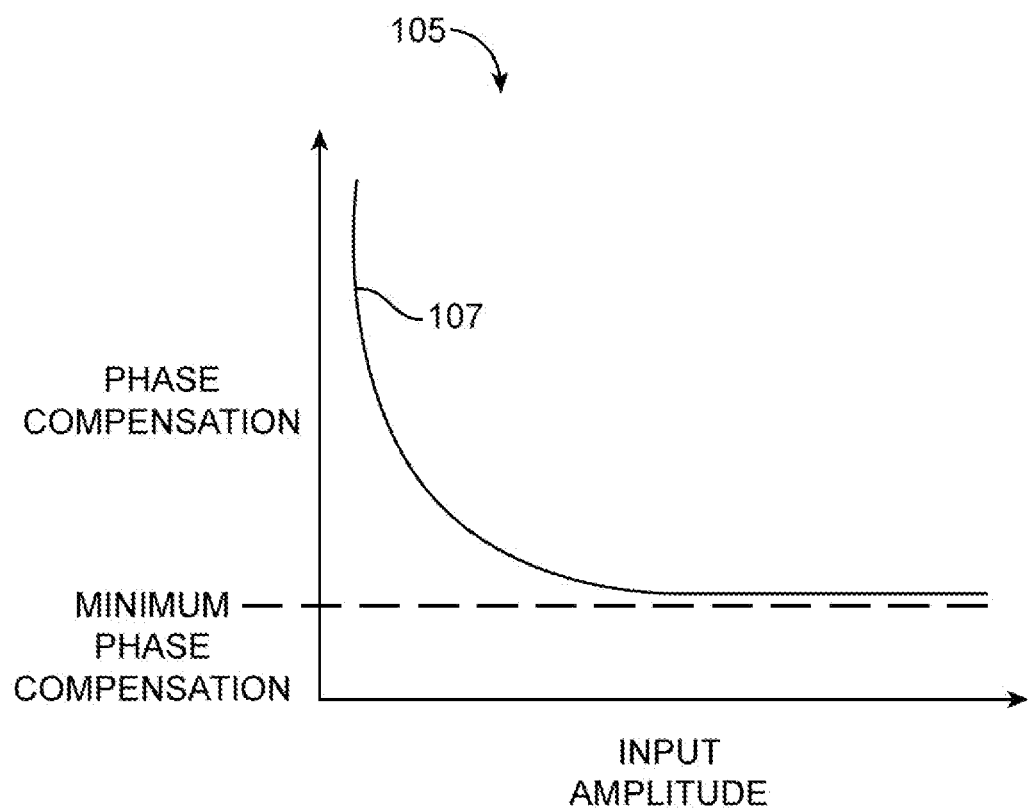
FIG. 2B is a graph showing how the required pre-distortion phase compensation of a typical power amplifier depends on the amplitude of an input signal.

FIG. 2B shows how the pre-distortion compensation required to correct a phase distortion of a typical power amplifier varies with respect to the amplitude of the input signal to the power amplifier. As shown by phase compensation curve 107 of graph 105 of FIG. 2B, for relatively small input amplitudes, a typical power amplifier generates a large phase distortion and therefore requires a large phase compensation. For relatively larger input amplitudes, the required phase compensation is smaller and asymptotes to a minimum phase compensation for very large input amplitudes.

Figure 3:
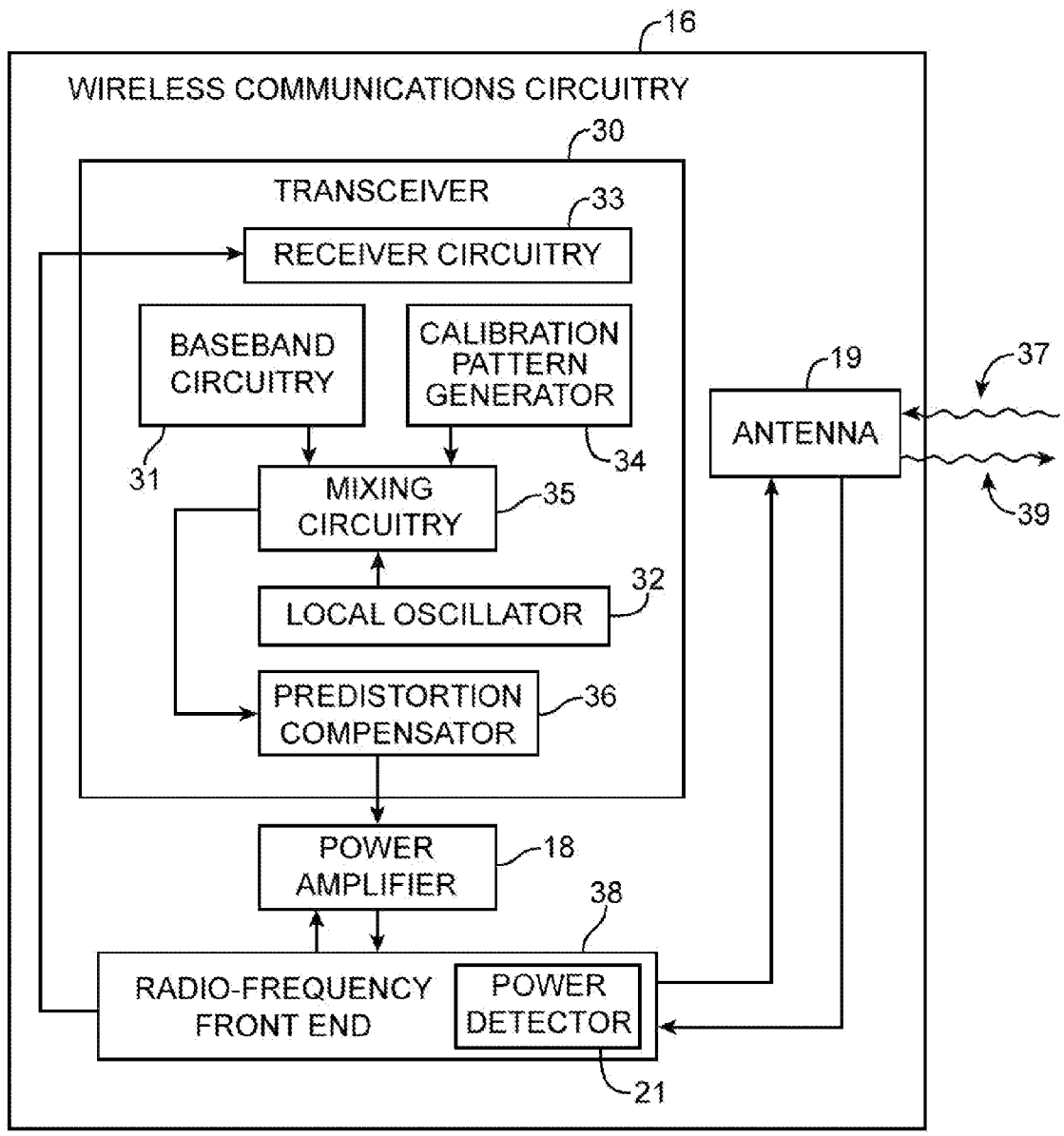
FIG. 3 is a diagram of illustrative wireless communications circuitry having a power amplifier and a transceiver having a calibration pattern generator and a pre-distortion compensator in accordance with an embodiment of the present invention.

Wireless communications circuitry of the type that may be provided with pre-distortion compensation circuitry is shown in FIG. 3. As shown in FIG. 3, an electronic device of the type shown in FIG. 1 may include wireless communications circuitry 16 having a transceiver such as transceiver 30 for use in transmitting and receiving radio-frequency (RF) signals. Transceiver 30 may include receiver circuitry such as receiver circuitry 33 that is coupled to one or more antennas such as antenna 19. Receiver circuitry 33 of transceiver 30 may be configured to process incoming signals such as incoming signal 37. Transceiver 30 may include one or more local oscillators such as local oscillator 32. Local oscillator 32 may be configured to generate a carrier signal that is mixed with a modulating data signal using mixing circuitry 35 prior to transmission of data using wireless communications circuitry 16. During normal operations of device 10, data signals may be generated using baseband circuitry 31. Data signals generated with baseband circuitry 31 may be mixed with carrier signals generated by local oscillator 32. Mixing carrier signals generated by local oscillator 32 with data signals generated using baseband circuitry 31 may include modulating the carrier signal with the data signal. Modulating the carrier signal with the data signal may include any suitable type of carrier signal modulation (e.g., amplitude modulation, frequency modulation, phase modulation, etc.). Modulating carrier signals with data signals using digital in-phase/quadrature-phase (I/Q) phase-shift-keying (PSK) is sometimes described herein as an example.

As shown in FIG. 3, transceiver 30 may be coupled to power amplifier 18. Power amplifier 18 may be configured to amplify a signal generated by transceiver 30 prior to transmission of the signal using a radio-frequency front end such as RF front end 38 and one or more antennas such as antenna 19. Signals such as transmitted signal 39 may be transmitted using antenna 19. Antenna 19 may be formed separately from RF front end 38 or may be formed as a portion of RF front end 38. RF front end 38 may include one or more integrated circuits for performing filtering, low-noise amplification, frequency conversion, etc. of received RF signal 37 and transmitted RF signal 39. If desired, RF front end 38 may be associated with a power detector such as power detector 21. Power detector 21 and power amplifier 18 may form a portion of a power feedback loop (e.g., a power feedback loop internal to device 10, a power feedback loop that uses communications with an external network, etc.) for determining a desired amount of amplification by power amplifier 18. For example, RF front end 38 and power detector 21 may form a portion of a power control feedback loop (e.g., open loop power control, closed loop power control, etc.) in which the detected power of received RF signal 37 is used to determine a desired level of power amplification by power amplifier 18. Power detector 21 may be formed separately from RF front end 38 or may be formed as an integrated portion of RF front end 38.

As shown in FIG. 3, transceiver 30 may include a pre-distortion compensator such as pre-distortion compensator 36 (also sometimes referred to herein as pre-distortion compensation circuitry, pre-distortion circuitry, etc.). Pre-distortion compensator 36 may be configured to compensate for distortions of a signal by power amplifier 18 (e.g., to alter a signal generated by transceiver 30 such that, following amplification using power amplifier 18, the signal generated by transceiver 30 is substantially undistorted). As an illustrative example of pre-distortion compensation for power amplifier distortion of a signal, transceiver 30 may generate a signal having a low power (small amplitude) component PL (power low) and a high power (large amplitude) component PH (power high). Power amplifier 18 may amplify low power component PL by a gain factor g such that the output signal from power amplifier 18 corresponding to low power component PL has an output power PO=g*PL. Power amplifier 18 may have a non-linear (distorting) amplification for high power input signals. Therefore, power amplifier 18 may amplify high power component PH by a gain factor (for example) 0.5*g such that the output signal from power amplifier 18 corresponding to high power component PH is only PO=0.5*g*PH. In this example, pre-distortion compensator 36 may be configured to boost (e.g., increase the amplitude) high power component PH by a factor of 2 prior to amplification by power amplifier 18 so that the output signal from power amplifier 18 corresponding to pre-distorted high power component PH_pdist=2.0*PH is PO=0.5*g*PH_pdist=g*PH. In this way, a linear gain may be applied to input signals PL and PH. This is merely illustrative.

In practice, power amplifier 18 may have more complicated distorting effects on an input signal (e.g., frequency distortion, phase distortion, etc.). Pre-distortion compensator 36 may be configured to pre-distort an input signal to power amplifier 18 to compensate for these more complicated effects. Pre-distortion compensator 36 may be configured to pre-distort the input signal in a way that is inverse to the distortions of power amplifier 18 so that the output signal from power amplifier 18 suffers from reduced distortions in amplitude, frequency, and/or phase. In order to provide pre-distortion compensators such as pre-distortion compensator 36 that compensate for signal distortion by associated power amplifiers, the signal distortion exhibited by the each associated power amplifier may first be measured (e.g., the power amplifier output may be calibrated).

In order to measure signal distortion caused by a power amplifier such as power amplifier 18, a transceiver 30 may be provided with a calibration pattern generator such as calibration pattern generator 34. Calibration pattern generator 34 may be configured to generate a predetermined signal having a known amplitude-modulated calibration pattern. During calibration operations, the known amplitude-modulated calibration pattern may be mixed with a carrier signal from local oscillator 32 to form a known pre-amplified calibration signal. The known pre-amplified calibration signal may include in-phase and quadrature phase (I/Q) components. The known pre-amplified calibration signal may be passed through pre-distortion compensator 36 without modification. If desired, the known pre-amplified calibration signal may be passed directly to power amplifier 18 without passing through pre-distortion compensator 38. The known pre-amplified calibration signal may then be amplified by power amplifier 18 to form an amplified amplitude-modulated calibration signal. The amplified amplitude-modulated calibration signal may be transmitted to a calibration system using RF front end 38 and antenna 19. The amplitude-modulated calibration signal may include distortions in amplitude, phase, and/or frequency generated during amplification using power amplifier 18. The calibration system may be configured to use the amplifier-distorted amplitude-modulated calibration signal to measure the power amplifier distortion and to extract pre-distortion coefficients based on the measured power amplifier distortion.

Once the signal distortion of a power amplifier such as power amplifier 18 has been measured, pre-distortion information for pre-distortion compensator 36 may be represented by one or more pre-distortion coefficients. Pre-distortion coefficients measured during calibration of wireless communications circuitry 16 may be stored by device 10 in memory associated with transceiver 30, or other memory associated with wireless circuitry 16. During normal operation of a device such as device 10, pre-distortion compensator 36 may use pre-distortion coefficients determined during calibration operations to pre-distort signals generated by mixing circuitry 35 prior to signal amplification by power amplifier 18. During normal operation of device 10, power detector 21 may be used to detect the power of a signal (e.g., an amplified signal from power amplifier 18, an incoming signal such as incoming signal 37, etc.). Power detector 21 may be used as a portion of an open loop or closed loop power control system that adjusts the amount of amplification by power amplifier 18 depending on the detected power the signal.

Figure 4:
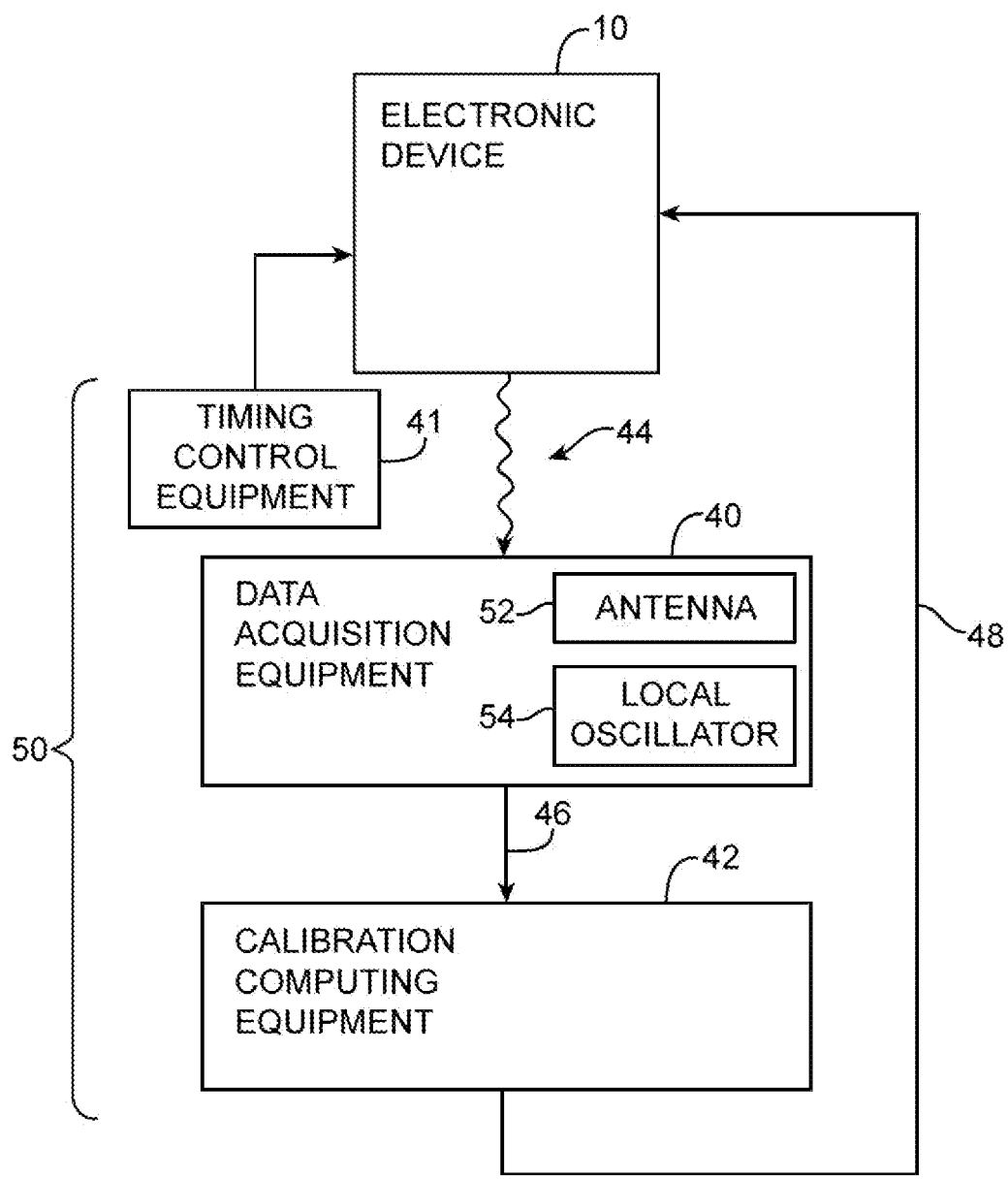
FIG. 4 is a diagram of an illustrative calibration system for determining pre-distortion coefficients including timing control equipment, data acquisition equipment, and calibration computing equipment in accordance with an embodiment of the present invention.

FIG. 4 is a diagram of an illustrative calibration system that may be used in calibrating devices such as device 10. As shown in FIG. 4, calibration system 50 may include timing control equipment 41 and signal receiving and processing equipment such as data acquisition equipment 40 coupled to computing equipment such as calibration computing equipment 42. Timing control equipment 41 may include external computing equipment configured to initiate a calibration sequence. Timing control equipment 41 may be configured to precisely control the time at which a known amplifier-distorted amplitude-modulated calibration signal is transmitted from device 10 to data acquisition equipment 40. Data acquisition equipment 40 may include one or more antennas such as antenna 52. Data acquisition equipment 40 may be configured to use antenna 52 to receive the amplifier-distorted amplitude-modulated calibration signal transmitted wirelessly by device 10 along wireless path 44 during calibration operations. Data acquisition equipment 40 may include a local oscillator such as local oscillator 54 that produces a signal at a frequency that is substantially similar to the frequency of the carrier signal produced by local oscillator 32 of device 10. The amplifier-distorted calibration signal that is received by data acquisition equipment 40 may include the local oscillator carrier signal generated by local oscillator 32 of device 10 modulated with the known AM calibration pattern. Local oscillator 54 of data acquisition equipment 40 may be used to generate a signal to be mixed with the received amplifier-distorted AM calibration signal carrying the known AM calibration pattern so that amplifier-distorted calibration data may be extracted from the received signal. During calibration operations, the frequency of the signal produced by local oscillator 54 of data acquisition equipment 40 may drift with respect to the frequency of the carrier signal produced by local oscillator 32 of device 10. A frequency drift of this type may appear in calibration data as a phase distortion (e.g., a bulk phase drift, also sometime referred to herein as phase drift) in addition to distortions produced by power amplifier 18 of device 10.

Communications systems that use local oscillators commonly overcome relative local oscillator frequency drifts by including an un-modulated frequency locking component in communicated data. This frequency calibration component is additional data used to "lock" one local oscillator to the frequency of the other.

Radio-frequency calibration signals may be captured by data acquisition equipment 40 and converted to in-phase/quadrature-phase (I/Q) data samples by data acquisition equipment 40. I/Q data samples may be transferred to calibration computing equipment 42 along path 46. Path 46 may be a wired or wireless path. In one preferred embodiment that is sometimes described herein as an example, data acquisition equipment 40 and calibration computing equipment 42 may be connected by a path 46 that includes a General Purpose Interface Bus (GPIB) cable.

Transfer of digitized calibration data from data acquisition equipment 40 to calibration computing equipment 42 may take an amount of time that is proportional to the amount of calibration data that is transferred. Common calibration systems typically suffer from a data "bottleneck" during transfer of data from RF receiver components to calibration computers. Including a frequency locking component in calibration data may therefore be inefficient because the additional frequency locking component of the calibration data must be transferred (along with the amplitude-modulated pre-distortion calibration data) from data acquisition equipment 40 to calibration computing equipment 42. While calibration pattern generators are commonly preprogrammed to produce calibration patterns that include frequency locking components, calibration systems such as calibration system 50 may be provided that more efficiently obtain calibrated pre-distortion coefficients for devices such as device 10 by extracting frequency locking information from amplitude-modulated pre-distortion calibration data that does not contain a dedicated un-modulated frequency locking component.

Calibration system 50 may be configured to calibrate pre-distortion settings for tens, hundreds, thousands, tens of thousands, hundreds of thousands, millions, tens of millions, or more of devices such as device 10. Providing calibration systems 50 that are capable of determining frequency locking information from amplitude-modulated pre-distortion calibration data (i.e., without requiring transfer of dedicated un-modulated frequency locking data) may therefore significantly reduce the time required to move devices such as device 10 from manufacturing to delivery to end users.

Amplitude-modulated pre-distortion calibration data (e.g., I/Q data samples) that is transferred from data acquisition equipment 40 to calibration computing equipment 42 may be processed using calibration computing equipment 42. Calibration computing equipment 42 may extract a local oscillator frequency drift correction (e.g., a bulk phase drift correction or phase drift correction) from the amplitude-modulated pre-distortion calibration data. Calibration computing equipment 42 may apply the determined bulk phase drift correction to the amplitude-modulated pre-distortion calibration data to generate phase drift corrected calibration data. Amplitude-modulated pre-distortion calibration may include amplifier distortions generated by power amplifier 18 (FIG. 3). Calibration computing equipment 42 may measure the amplifier distortion of the amplifier-distorted amplitude-modulated pre-distortion calibration data by comparing the phase drift corrected calibration data to the known AM calibration pattern that was generated by calibration pattern generator 34 (FIG. 3). Calibration computing equipment 42 may then extract pre-distortion coefficients from the results of the comparison of the phase drift corrected calibration data and the known AM input signal. Following extraction of the pre-distortion coefficients from the amplitude-modulated pre-distortion calibration data, calibration computing equipment 42 may transmit the pre-distortion coefficients along path 48 to transceiver 30 of device 10. Path 48 may be a wired or wireless communications path.

Pre-distortion coefficients measured during calibration of wireless communications circuitry 16 may be stored by device 10 in memory associated with transceiver 30, or other memory associated with wireless circuitry 16. During normal operation of a device such as device 10, pre-distortion compensator 36 may use pre-distortion coefficients determined during calibration operations to pre-distort signals generated by transceiver 30 prior to signal amplification by power amplifier 18 so that the signal that has been amplified by power amplifier 18 has the same signal quality as the signal that is input to the pre-distorter.

Figure 5:
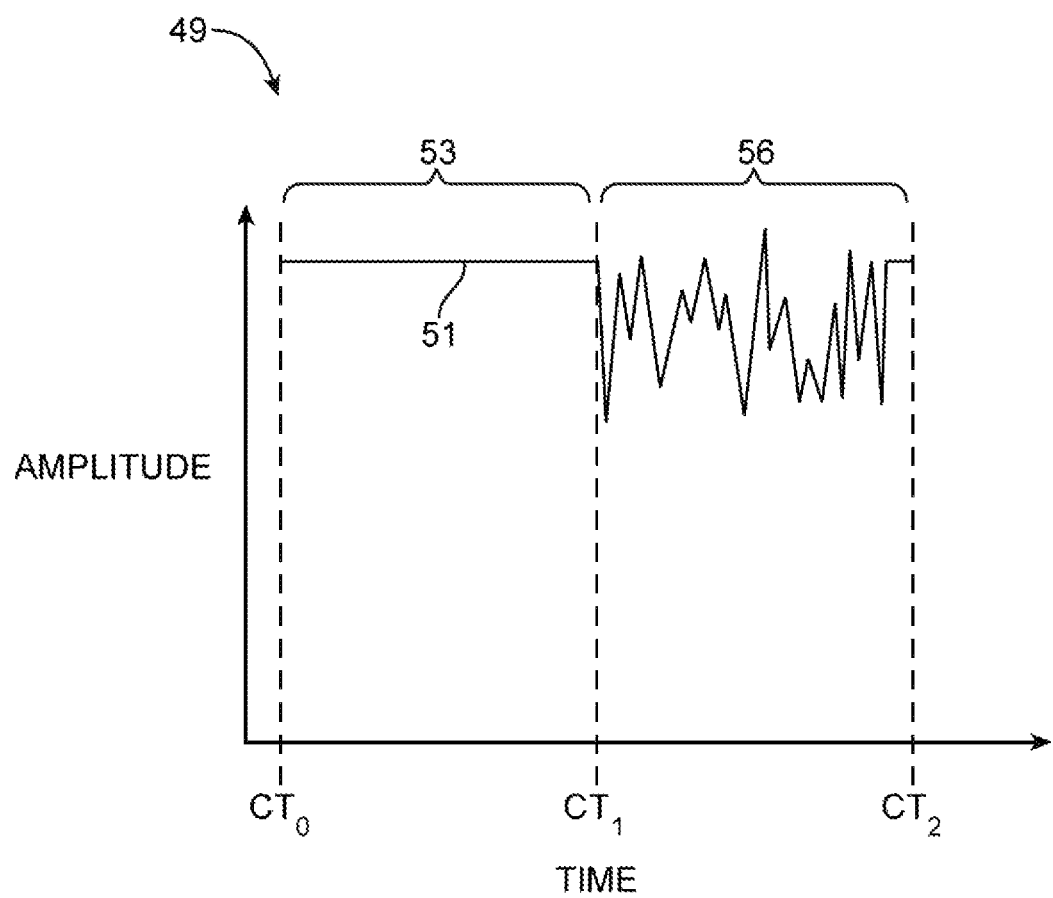
FIG. 5 is a graph showing a conventional calibration pattern for calibrating a pre-distortion compensator.

FIG. 5 is a graph of a typical calibration pattern containing both amplitude-modulated calibration data and an un-modulated frequency locking component. As shown in FIG. 5, graph 49 contains calibration pattern 51. Calibration pattern 51 includes frequency locking portion 53 and amplitude-modulated portion 56. Frequency locking portion 53 is commonly used to lock the frequency of a local oscillator associated with a transmitter with the frequency of a local oscillator associated with a receiver. During typical calibration operations, frequency locking portion 53 of calibration pattern 52 is transmitted starting at a time $CT_0$ and continuing until a time $CT_1$. Following transmission of frequency locking portion 53, at time $CT_1$, amplitude-modulated portion 56 is transmitted until a later time $CT_2$. The quantity of data contained in frequency locking portion 53 is often comparable to the quantity of data contained in amplitude-modulated portion 56. Transmitting calibration patterns containing both un-modulated frequency locking and amplitude-modulated calibration portions is therefore inefficient for calibration of large numbers of devices.

Figure 6:
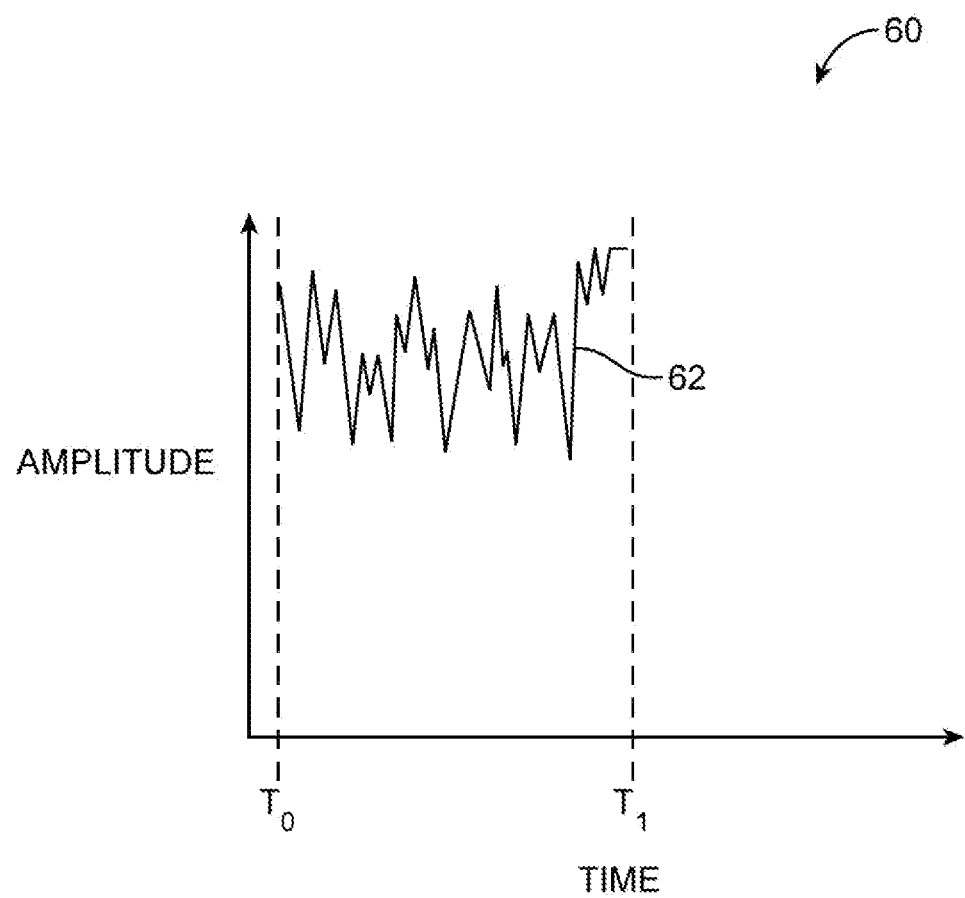
FIG. 6 is a graph showing an illustrative calibration pattern for improved determination of pre-distortion coefficients during manufacturing in accordance with an embodiment of the present invention.

FIG. 6 is a graph of a calibration pattern that may be used to calibrate a device such as device 10 using calibration system 50 of FIG. 4. As shown in FIG. 6, graph 60 contains only amplitude-modulated calibration pattern 62.

Amplitude-modulated calibration pattern 62 may be transmitted beginning at a time $T_0$ and ending at a time $T_1$. The data contained in known amplitude-modulated calibration pattern 62 may be substantially less than typical calibration patterns that contain an un-modulated frequency locking component. Amplitude-modulated calibration pattern 62 may be represented in polar space as in-phase (I) and quadrature phase (Q) components.

The amplitude of a signal may be expressed in I/Q space components as shown by the following equation:

$$\text{AMPLITUDE} = SQRT(I^2 + Q^2), \quad (1)$$

where SQRT( ) indicates the square root function. The phase of a signal may be expressed in I/Q space components as shown by the following equation:

$$\text{PHASE} = \arctan(Q/I), \quad (2)$$

where arctan( ) represents the arctangent function. Equations 1 and 2 may be used to convert from amplitude/phase space to I/Q space (i.e., from an amplitude/phase representation of data to an I/Q representation of the data). A calibration pattern of the type shown in FIG. 6 may be mixed with a carrier signal, amplified (and distorted by the amplifier) and transmitted to data acquisition equipment 40 as described above in connection with FIGS. 3 and 4.

Figure 7:
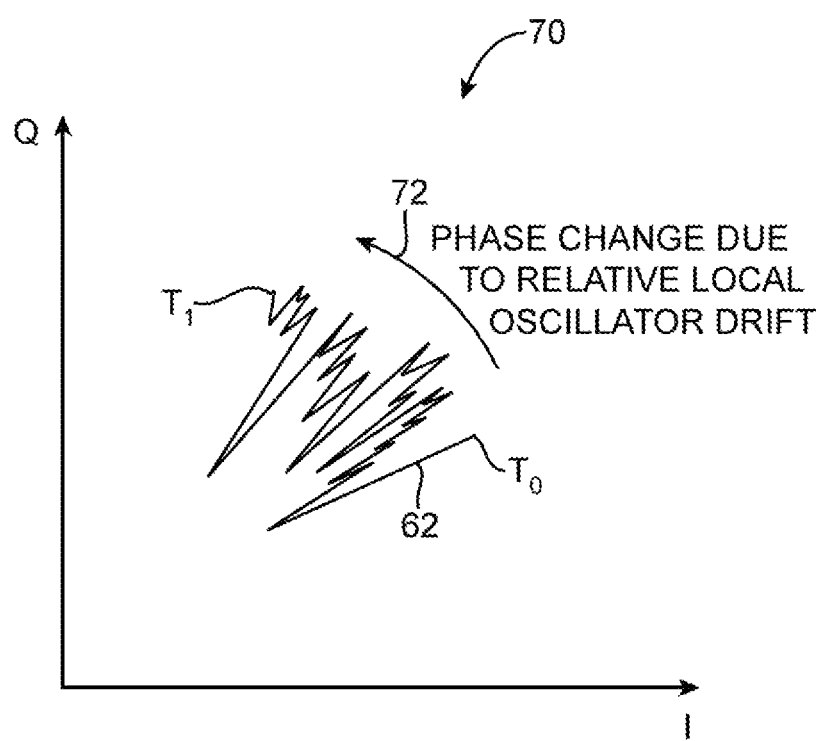
FIG. 7 is a graph showing an illustrative in-phase/quadrature-phase representation of a calibration pattern of the type shown in FIG. 6 that is affected by relative local oscillator frequency drift in accordance with an embodiment of the present invention.

An amplitude-modulated calibration signal that has been distorted by a power amplifier and captured using a local oscillator that is drifting with respect to the transmitting local oscillator is shown in FIG. 7. Graph 70 shows an I/Q polar representation 62' of modulated calibration curve 62 of FIG. 6. I/Q polar representation 62' includes an additional phase distortion (e.g., a bulk phase drift) due to relative frequency drift of local oscillator 54 of data acquisition equipment 40 with respect to local oscillator 32 of device 10. In graph 70, the amplitude of signal 62' is represented by the distance of a point from the zero crossing of the I and Q axes. In graph 70, the phase of signal 62' is represented by the angular distance of a point counter-clockwise from the I axis. Amplitude-modulated calibration pattern 62 is not phase modulated. Therefore, in the absence of relative local oscillator drift, no bulk angular change in curve 62' would be observed. Therefore, information about the relative local oscillator frequency drift is contained in the overall phase drift of amplitude-modulated calibration signal 62' in direction 72 between the point transmitted at time $T_0$ and the point transmitted at time $T_1$. Calibration computing equipment 42 of calibration system 50 may be configured to extract the information about the relative local oscillator frequency drift (e.g., the phase drift) from amplitude-modulated calibration signal 62'.

Figure 8:
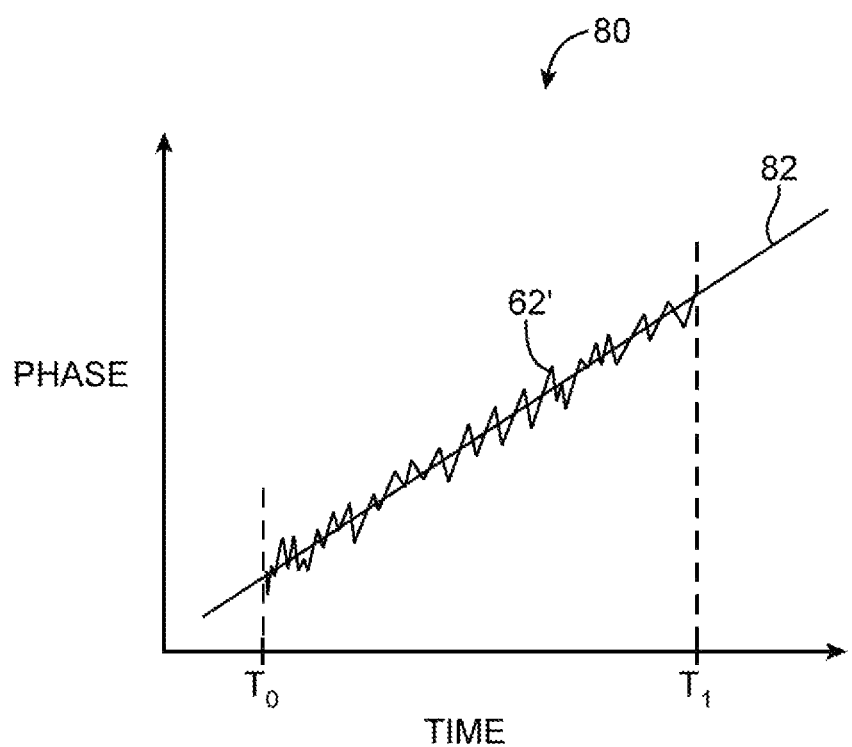
FIG. 8 is an illustrative graph showing a phase drift correction function determined from amplitude-modulated calibration data of the type shown in FIG. 7 in accordance with an embodiment of the present invention.

Given I and Q and the relative arrival time of each data point in amplitude-modulated calibration curve 62', computing equipment 42 may be used to convert I/Q polar representation 70 of amplitude-modulated calibration curve 62' into phase vs. time representation 80 of amplitude-modulated calibration curve 62', as shown in FIG. 8. Calibration computing equipment 42 may use equation 2 to determine the phase of each point from the I and Q of each point. Calibration computing equipment 42 may use any suitable curve fitting algorithm (e.g., linear regression, least squares fitting, least absolute deviation fitting, etc.) to extract phase drift information such as phase drift information curve 82 from amplitude-modulated calibration curve 62'. Phase drift information curve 82 may be used by computing equipment 42 to generate a local oscillator frequency drift correction (also sometimes referred to herein as a phase drift correction of bulk phase drift correction). The local oscillator frequency drift correction may be used by calibration computing equipment 42 to remove the phase distortion of amplitude-modulated calibration curve 62' due to the relative frequency drift of local oscillator 54 of data acquisition equipment 40 and local oscillator 32 of wireless communications circuitry 16. Calibration computing equipment 42 may remove the phase distortion of amplitude-modulated calibration curve 62' by subtracting from each data point on amplitude-modulated calibration curve 62' a corresponding point on phase drift information curve 82.

Figure 9:
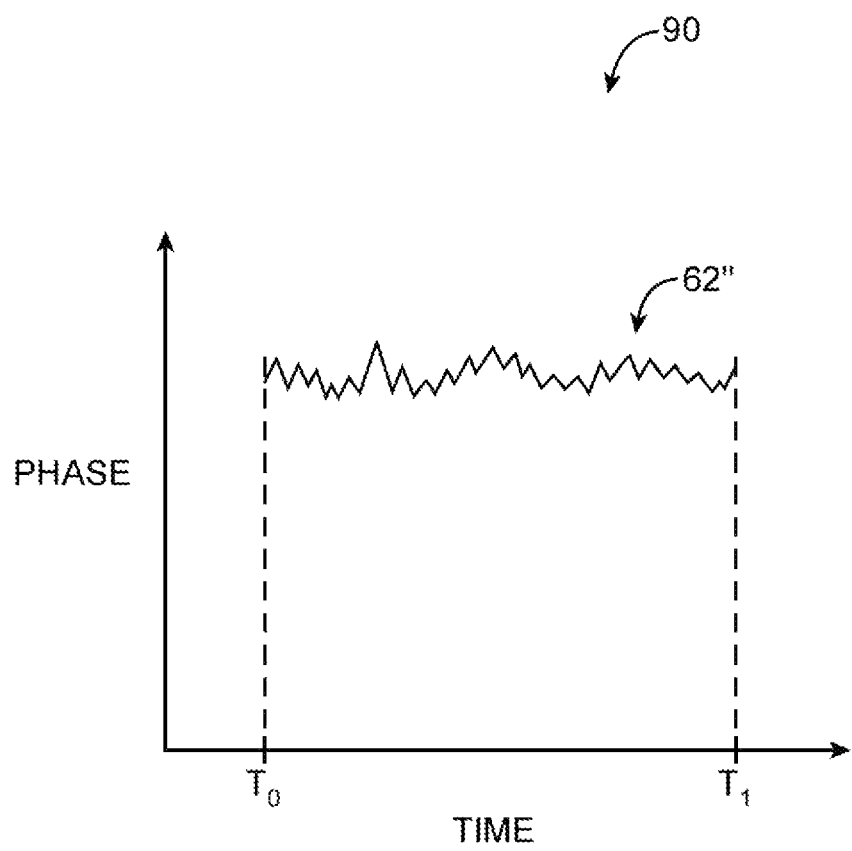
FIG. 9 is an illustrative graph showing phase drift corrected calibration data in accordance with an embodiment of the present invention.

The effect of subtracting from each data point on amplitude-modulated calibration curve 62' a corresponding point on phase drift information curve 82 is shown in graph 90 of FIG. 9. As shown in FIG. 9, subtracting a corresponding point on phase drift information curve 82 from each data point on amplitude-modulated calibration curve 62' results in phase drift corrected calibration data curve 62". Phase drift corrected calibration data curve 62" may have small variations in phase (e.g., due to phase distortions generated by power amplifier 18) and may have bulk phase drifts substantially removed.

Figure 10:
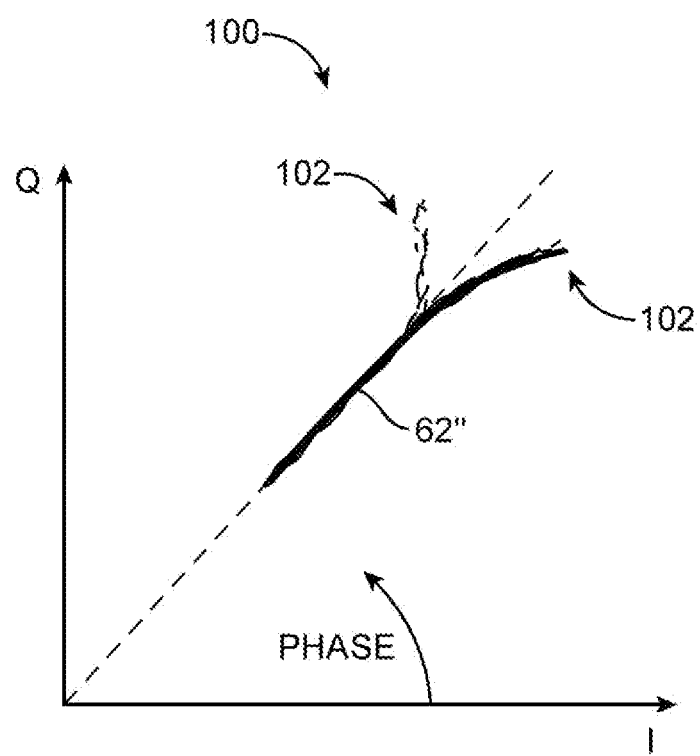
FIG. 10 is an illustrative graph showing an in-phase/quadrature-phase representation of phase drift corrected calibration data of the type shown in FIG. 9 in accordance with an embodiment of the present invention.

Phase drift corrected AM calibration data curve 62" may be represented in I/Q space as shown in FIG. 10. As shown in FIG. 10, phase drift corrected AM calibration data curve 62" of graph 100 may contain data points at substantially one phase (i.e., most of the data points lie at a single angular distance from the I axis). Data points on frequency-corrected calibration data curve 62" may have a wide range of amplitudes (i.e., distances from the zero crossing of the I and Q axes) corresponding to the amplitude modulations in the amplitude-modulated calibration pattern generated by calibration pattern generator 34 (FIG. 3). Data points on phase drift corrected calibration data curve 62" may show excursions such as deviations 102 from a single phase. Because amplitude-modulated calibration pattern 62 generated by calibration pattern generator 34 does not include phase modulations, deviations 102 may represent deviations caused by distortions induced by power amplifier 18. Calibration computing equipment 42 may be configured to extract information about distortions caused by power amplifier 18 from phase drift corrected calibration data curve 62". Extracting information about distortions caused by power amplifier 18 from frequency-corrected calibration data curve 62" may include comparing data points on phase drift corrected calibration data curve 62" to corresponding data points in known amplitude-modulated calibration pattern 62. Each data point on phase drift corrected calibration data curve 62″ may have an associated phase drift corrected phase and amplitude.

Figure 11:
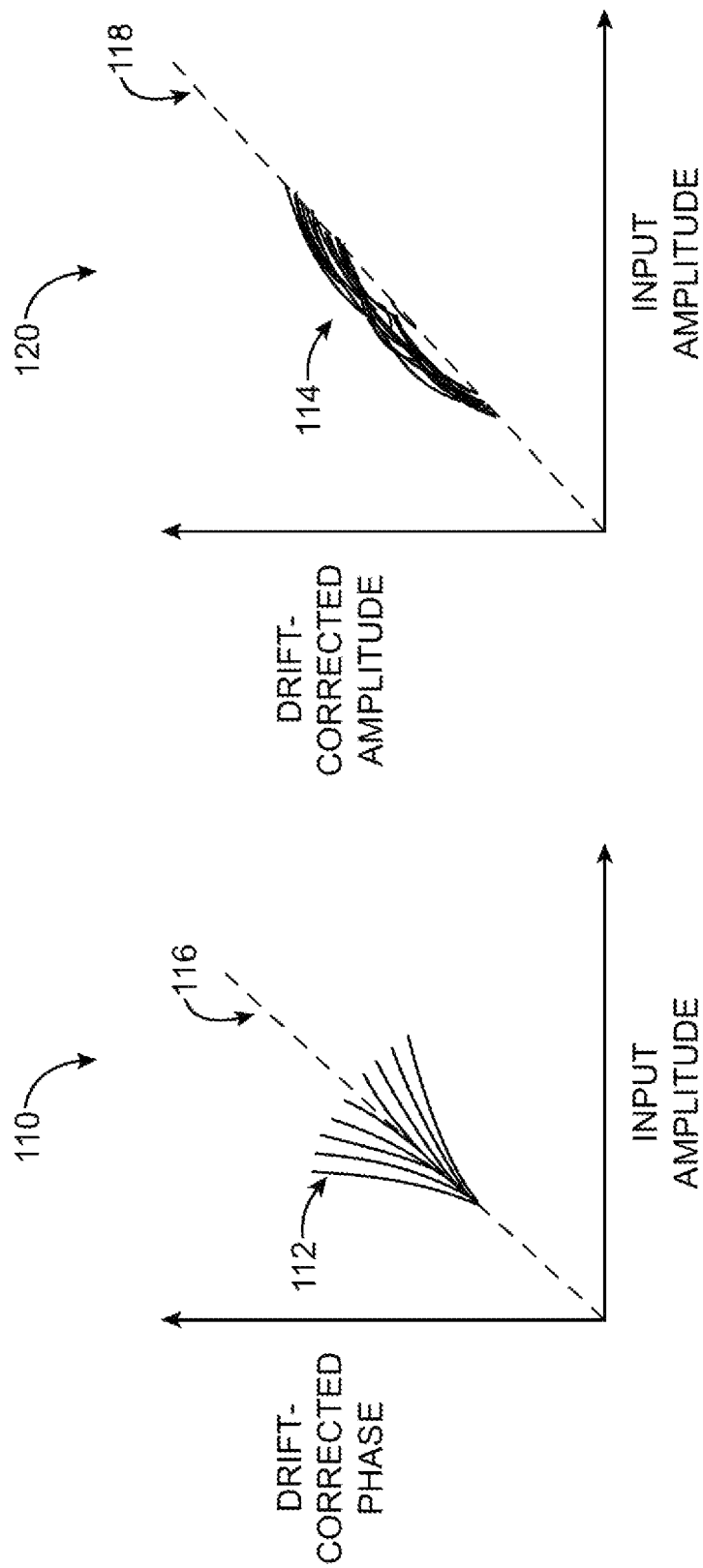
FIG. 11 is a pair of graphs showing an illustrative comparison of corrected calibration data of the type shown in FIG. 9 in accordance with an embodiment of the present invention.

Phase drift corrected phase and phase drift corrected amplitude of data points on phase drift corrected calibration data curve 62″ may be compared with a corresponding amplitude in known amplitude-modulated calibration pattern 62 using calibration computing equipment (FIG. 3). Graphs 110 and 120 of FIG. 11 show how phase drift corrected (or simply drift-corrected) phase and phase drift corrected (or simply drift-corrected) amplitude respectively of data points on phase drift corrected calibration data curve 62″ may compare with a corresponding input amplitude in known amplitude-modulated calibration pattern 62. As shown in FIG. 11, PHASE-AMPLITUDE curve 112 may show deviations from a single phase such as single phase 116. AMPLITUDE-AMPLITUDE curve 114 may show deviations from linear amplitude ratio (gain) curve 118. Because amplitude-modulated calibration pattern 62 generated by calibration pattern generator 34 does not include phase modulations, deviations of PHASE-AMPLITUDE curve 112 from single phase 116 may represent deviations caused by distortions induced by power amplifier 18. Because a perfect power amplifier would amplify each input amplitude by a common factor, deviations of AMPLITUDE-AMPLITUDE curve 114 from linear amplitude ratio 118 may represent deviations caused by distortions induced by power amplifier 18. Calibration computing equipment 42 may be configured to extract pre-distortion coefficients from the comparison the PHASE-AMPLITUDE and AMPLITUDE-AMPLITUDE comparisons of frequency-corrected calibration data curve 62″ and known amplitude-modulated calibration pattern 62.

Figure 12:
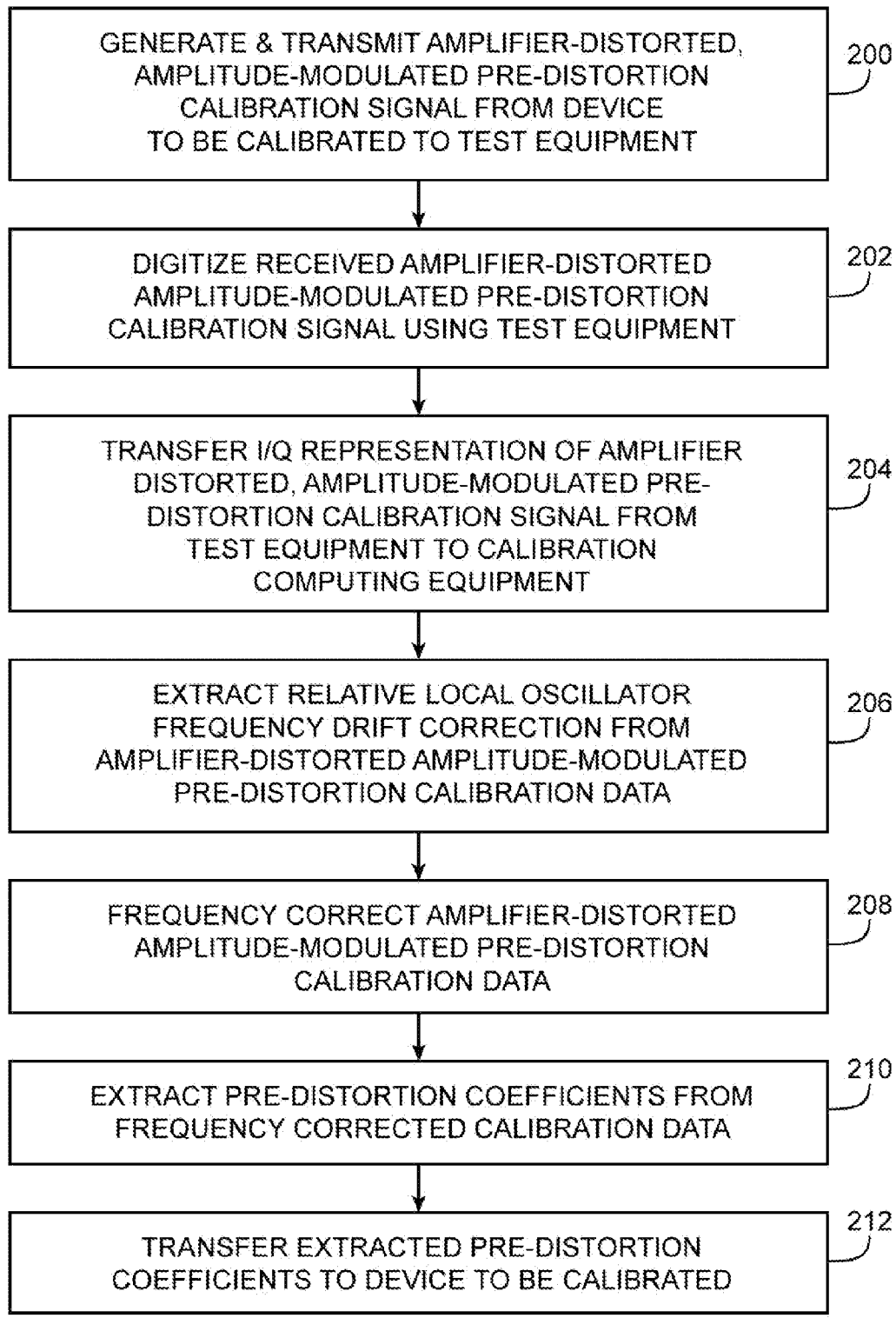
FIG. 12 is a flow chart of illustrative steps involved in performing wireless communications calibration of electronic devices having wireless communications circuitry in accordance with an embodiment of the present invention.

To conduct wireless communications calibration of a device using a calibration system of the type shown in FIG. 4, the steps of the illustrative flowchart of FIG. 12 may be performed.

At step 200, device 10 may be used to generate and transmit an amplifier-distorted amplitude-modulated calibration signal to data acquisition equipment such as data acquisition equipment 40 of FIG. 3. Generating an amplifier-distorted amplitude-modulated calibration signal may include generating a known amplitude-modulated calibration pattern using calibration pattern generator 34, generating a carrier signal using local oscillator 32, modulating the carrier signal with the known amplitude-modulated calibration pattern and amplifying the modulated carrier signal using power amplifier 18. Transmitting the amplifier-distorted amplitude-modulated calibration signal may include using an RF front end such as RF front end 38 and one or more antennas such as antenna 19 to transmit the data.

At step 202, the amplifier-distorted amplitude-modulated calibration signal may be digitized using data acquisition equipment 40 of FIG. 4. The amplifier-distorted amplitude-modulated calibration signal may be transformed by data acquisition equipment 40 into an I/Q pair representation.

At step 204, the I/Q pair representation of the amplifier-distorted amplitude-modulated calibration signal may be transferred from data acquisition equipment 40 to calibration computing equipment 42.

At step 206, calibration computing equipment 42 may be used to extract a relative local oscillator frequency drift correction from the amplifier-distorted amplitude-modulated calibration signal. Extracting the relative local oscillator frequency drift correction from the amplifier-distorted amplitude-modulated calibration signal may include using a suitable curve fitting operation that determines a bulk phase drift from the amplifier-distorted amplitude-modulated calibration signal.

At step 208, calibration computing equipment 42 may be used to phase drift correct (i.e., apply a phase drift correction) the amplifier-distorted amplitude-modulated calibration signal (i.e., remove the bulk phase drift induced by the relative frequency drift of local oscillators associated with device 10 and data acquisition equipment 40).

At step 210, pre-distortion coefficients may be extracted from the phase drift corrected amplifier-distorted amplitude-modulated calibration signal. Extracting pre-distortion coefficients from the phase drift corrected amplifier-distorted amplitude-modulated calibration signal may include comparing the phase drift corrected amplifier-distorted amplitude-modulated calibration signal to the known input amplitude-modulated calibration pattern generated by calibration pattern generator 34 of device 10. Comparing the phase drift corrected amplifier-distorted amplitude-modulated calibration signal to the known input amplitude-modulated calibration pattern may include comparing received phase information to known input amplitude information and comparing received amplitude information to known input amplitude information.

At step 212, the extracted pre-distortion coefficients may be transferred from calibration computing equipment to device 10 to be stored on device 10 and used by device 10 when generating signals during normal operation of device 10.

The foregoing is merely illustrative of the principles of this invention and various modifications can be made by those skilled in the art without departing from the scope and spirit of the invention.

What is claimed is:

1. A method of calibrating an electronic device having wireless communications circuitry with a calibration system, wherein the calibration system includes data acquisition equipment and calibration computing equipment and wherein the wireless communications circuitry comprises a calibration pattern generator and local oscillator, the method comprising:

with the wireless communications circuitry, transmitting an amplitude-modulated calibration signal to the data acquisition equipment;

with the data acquisition equipment, transferring the amplitude-modulated calibration signal to the calibration computing equipment;

with the calibration computing equipment, extracting a phase drift correction from the amplitude-modulated calibration signal;

with the calibration computing equipment, extracting pre-distortion coefficients from the amplitude-modulated calibration signal;

with the calibration pattern generator, generating a known amplitude-modulated calibration pattern;

with the local oscillator, generating a carrier signal; and with the wireless communications circuitry, before transmitting the amplitude-modulated calibration signal to the data acquisition equipment, modulating the carrier signal with the known amplitude-modulated calibration pattern to create the amplitude-modulated calibration signal.

2. The method defined in claim 1 further comprising:

with the calibration computing equipment, applying the phase drift correction to the amplitude-modulated calibration signal.

3. The method defined in claim 2 wherein extracting the pre-distortion coefficients from the amplitude-modulated calibration signal comprises extracting the pre-distortion coefficients from the phase drift corrected amplitude-modulated calibration signal.

4. The method defined in claim 1 wherein the wireless communications circuitry comprises a power amplifier that amplifies the amplitude-modulated calibration signal prior to transmitting the amplitude-modulated calibration signal to the data acquisition equipment.

5. The method defined in claim 4 wherein the amplitude-modulated calibration signal is distorted by the power amplifier and wherein extracting the pre-distortion coefficients from the amplitude-modulated calibration signal comprises comparing the distorted amplitude-modulated calibration signal with the known amplitude-modulated calibration pattern.

6. The method defined in claim 5 wherein the wireless communications circuitry further comprises a pre-distortion compensator, and wherein the pre-distortion compensator is configured to alter a communications signal generated by the wireless communications circuitry using the pre-distortion coefficients.

7. The method defined in claim 1 further comprising, transmitting the pre-distortion coefficients to the electronic device.

8. The method defined in claim 7 further comprising storing the pre-distortion coefficients using the wireless communications circuitry.

9. The method defined in claim 1 wherein extracting the phase drift correction from the amplitude-modulated calibration signal comprises using a linear regression procedure to extract the phase drift correction.

10. A calibration system for wireless communications calibration of an electronic device, comprising:
    data acquisition equipment having at least one local oscillator having a first frequency for receiving an amplifier-distorted amplitude-modulated calibration signal from the electronic device, wherein the electronic device comprises at least one local oscillator having a second frequency and wherein the first frequency has a drift with respect to the second frequency that causes a phase drift in the amplifier-distorted amplitude-modulated calibration signal; and
    calibration computing equipment for extracting a phase drift correction from the amplifier-distorted amplitude-modulated calibration signal.

11. The calibration system defined in claim 10 wherein the electronic device further comprises a power amplifier, wherein the power amplifier induces amplifier distortion in the amplifier-distorted amplitude-modulated calibration signal, and wherein the calibration computing equipment is configured to apply the phase drift correction to the amplifier-distorted amplitude-modulated calibration signal.

12. The calibration system defined in claim 11 wherein the electronic device further comprises a pre-distortion compensator for pre-distorting an input signal to the power amplifier and wherein the calibration computing equipment is configured to extract pre-distortion coefficients from the phase drift corrected amplifier-distorted amplitude-modulated calibration signal.

13. The calibration system defined in claim 12 wherein the electronic device comprises a calibration pattern generator that generates a known amplitude-modulated calibration pattern, wherein extracting the pre-distortion coefficients from the phase drift corrected amplifier-distorted amplitude-modulated calibration signal comprises comparing the known amplitude-modulated calibration pattern with the phase drift corrected amplifier-distorted amplitude-modulated calibration signal.

14. The calibration system defined in claim 13 wherein the data acquisition equipment is coupled to the calibration computing equipment using a General Purpose Interface Bus cable and wherein the data acquisition equipment is configured to transfer amplifier-distorted amplitude-modulated calibration data to the calibration computing equipment using the General Purpose Interface Bus cable.

15. A method for obtaining pre-distortion coefficients for an electronic device having a power amplifier and a first oscillator that operates at a first frequency, the method comprising:
    with the power amplifier, amplifying an amplitude-modulated calibration signal;
    transmitting the amplified amplitude-modulated calibration signal to data acquisition equipment having a second oscillator that operates at a second frequency, wherein drift between the first and second frequencies causes bulk phase drift in the amplified amplitude-modulated calibration signal;
    with calibration computing equipment, removing the bulk phase drift from the amplified amplitude-modulated calibration signal; and
    with the calibration computing equipment, measuring an amplifier distortion in the amplified amplitude-modulated calibration signal.

16. The method defined in claim 15 further comprising:
    with the data acquisition equipment, converting the amplified amplitude-modulated calibration signal into in-phase/quadrature-phase data samples; and
    with the data acquisition equipment, transferring the in-phase/quadrature-phase data samples to the calibration computing equipment.

17. The method defined in claim 16 further comprising:
    with the calibration computing equipment, using the measured amplifier distortion to obtain the pre-distortion coefficients.

18. The method defined in claim 17 wherein measuring the amplifier distortion comprises:
    with the calibration computing equipment, comparing a received amplitude associated with the in-phase/quadrature-phase data samples to a known input amplitude; and
    with the calibration computing equipment, comparing a received phase associated with the in-phase/quadrature-phase data samples to the known input amplitude.

* * * * *